(12) United States Patent
Gauger, Jr. et al.

(10) Patent No.: US 12,394,402 B2
(45) Date of Patent: Aug. 19, 2025

(54) AUDIO DEVICE HAVING AWARE MODE AUTO-LEVELER

(71) Applicant: Bose Corporation, Framingham, MA (US)

(72) Inventors: Daniel M. Gauger, Jr., Cambridge, MA (US); Mark Raymond Blewett, Framingham, MA (US); Christopher B. Ickler, Sudbury, MA (US)

(73) Assignee: Bose Corporation, Framingham, MA (US)

( * ) Notice: Subject to any disclaimer, the term of this patent is extended or adjusted under 35 U.S.C. 154(b) by 266 days.

(21) Appl. No.: 18/062,108

(22) Filed: Dec. 6, 2022

(65) Prior Publication Data
US 2023/0178063 A1 Jun. 8, 2023

Related U.S. Application Data

(60) Provisional application No. 63/286,659, filed on Dec. 7, 2021.

(51) Int. Cl.
*G10K 11/16* (2006.01)
*G10K 11/178* (2006.01)
*H04R 1/10* (2006.01)

(52) U.S. Cl.
CPC .. *G10K 11/17823* (2018.01); *G10K 11/17837* (2018.01); *G10K 11/17854* (2018.01);
(Continued)

(58) Field of Classification Search
CPC ....... G10K 11/17823; G10K 11/17837; G10K 11/17885; G10K 11/17854; G10K 2210/1081; H04R 1/1083; H04R 2460/01
(Continued)

(56) References Cited

U.S. PATENT DOCUMENTS 8,090,120 B2 1/2012 Seefeldt
2011/0261965 A1\* 10/2011 Parkins ................ H04R 1/1058
381/1
(Continued)

FOREIGN PATENT DOCUMENTS

EP 3285497 A1 \* 2/2018 ........ G10K 11/17837
WO WO-2019015910 A1 \* 1/2019 .............. A61F 11/14

OTHER PUBLICATIONS

Usher, "Automatically optimizing situation awareness and sound quality for an isolating earphone," AES Convention 129, Nov. 2010, 9 pages.
(Continued)

*Primary Examiner* — Ammar T Hamid
(74) *Attorney, Agent, or Firm* — Hoffman Warnick LLC

(57) ABSTRACT

Various implementations include systems for providing enhanced aware mode capabilities in an ANR audio device. In particular implementations, a method includes receiving an ambient noise signal from a microphone associated with a wearable audio device; determining a gain value based on a sound pressure level (SPL) of the ambient noise signal; generating a gain adjusted ambient noise signal by applying the gain value to the ambient noise signal; generating a total external microphone signal by adding the gain adjusted ambient noise signal to a noise reducing ambient signal; generating an expanded audio signal by selectively adjusting a source audio signal based on the gain adjusted ambient noise signal; and combining and outputting the expanded audio signal with the total external microphone signal to an acoustic transducer.

19 Claims, 6 Drawing Sheets

(52) U.S. Cl.
CPC ..... *G10K 11/17885* (2018.01); *H04R 1/1083* (2013.01); *G10K 2210/1081* (2013.01); *H04R 2460/01* (2013.01)

(58) Field of Classification Search
USPC ................................................ 381/71.6, 71.1
See application file for complete search history.

(56) References Cited

U.S. PATENT DOCUMENTS

2019/0130928 A1  5/2019  Rule et al.
2020/0143790 A1  5/2020  Trivedi et al.

OTHER PUBLICATIONS

PCT International Search Report and Written Opinion for International Application No. PCT/US2022/051928, dated Jun. 5, 2023, 18 pages.

\* cited by examiner

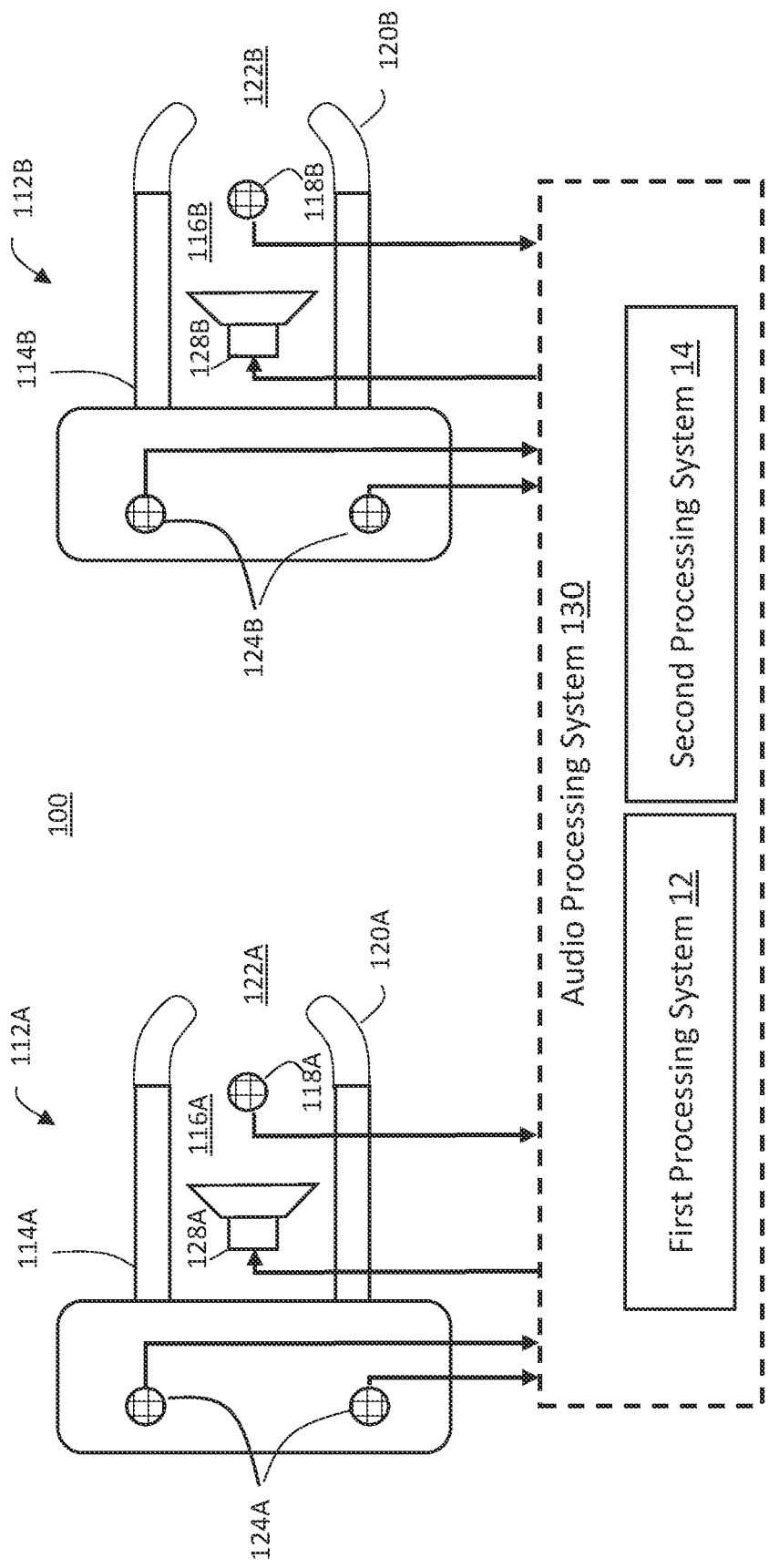

AUDIO DEVICE HAVING AWARE MODE AUTO-LEVELER

PRIORITY CLAIM

This application claims priority to U.S. Provisional Patent Application No. 63/286,659 filed on Dec. 7, 2021, which is incorporated by reference in its entirety.

TECHNICAL FIELD

This disclosure generally relates to active noise reduction (ANR) devices that provide enhanced aware mode functionality.

BACKGROUND

Acoustic devices such as headphones can include active noise reduction (ANR) capabilities that block at least portions of ambient noise from reaching the ear of a user. As such, ANR devices create an acoustic isolation effect, which isolates the user, at least in part, from the environment. To mitigate the effect of such isolation, some acoustic devices having ANR capabilities can include an "aware mode," in which ambient sounds are passed to the user's ears along with the source audio playing on the acoustic device.

SUMMARY

All examples and features mentioned below can be combined in any technically possible way.

Systems and approaches are disclosed directed at an active noise reduction device with enhanced aware mode functionality. Some implementations provide a method that includes: receiving an ambient noise signal from a microphone associated with a wearable audio device; determining a gain value based on a sound pressure level (SPL) of the ambient noise signal; generating a gain adjusted ambient noise signal by applying the gain value to the ambient noise signal; generating a total external microphone signal by adding the gain adjusted ambient noise signal to a noise reducing ambient signal; generating an expanded audio signal by selectively adjusting a source audio signal based on the gain adjusted ambient noise signal; and combining and outputting the expanded audio signal with the total external microphone signal to an acoustic transducer.

In additional particular implementations, a wearable audio device is provided that includes: an acoustic transducer; a microphone; and a signal processing system that performs actions comprising: receiving an ambient noise signal from a microphone associated with a wearable audio device; determining a gain value based on a sound pressure level of the ambient noise signal; generating a gain adjusted ambient noise signal by applying the gain value to the ambient noise signal; generating a total external microphone signal by adding the gain adjusted ambient noise signal to a noise reducing ambient signal; generating an expanded audio signal by selectively adjusting a source audio signal based on the gain adjusted ambient noise signal; and combining and outputting the expanded audio signal with the total external microphone signal to an acoustic transducer.

In further implementations, a method includes: obtaining a source audio signal and an ambient noise signal; comparing the ambient noise signal with a predefined hearing threshold; generating an effective noise signal in response to the comparing; generating an expanded audio signal by selectively adjusting a sound pressure level of the source audio signal based on the effective noise signal; and driving an acoustic transducer of a headphone using the expanded audio signal.

In yet other approaches, a method includes: receiving an ambient noise signal from a microphone associated with a wearable audio device; determining a gain value based on a sound pressure level of the ambient noise signal; generating a gain adjusted ambient noise signal by applying the gain value to the ambient noise signal; generating a total external microphone signal by adding the gain adjusted ambient noise signal to a noise reducing ambient signal; generating an expanded audio signal by selectively adjusting a source audio signal based on a noise control signal; and combining and outputting the expanded audio signal with the total external microphone signal to an acoustic transducer.

Implementations may include one of the following features, or any combination thereof.

In various implementations, a signal-to-noise ratio (SNR) is determined from the source audio signal and the gain adjusted ambient noise signal, wherein generating the expanded audio signal includes selectively adjusting the source audio signal based on the SNR.

In some cases, generating the noise control signal includes generating a residual sound component based on the SPL of the ambient noise signal; and adding the residual sound component to the gain adjusted ambient noise signal.

In certain cases, the gain value is determined with a look-up table having an SPL-to-gain value correspondence, the look-up table comprising: a first SPL threshold below which the gain value is set to 1; a second SPL threshold above which the gain value is set to 0; and an SPL range between the first SPL threshold and the second SPL threshold within which the gain value varies between 1 and 0.

In some instances, generating the expanded audio signal includes selectively adjusting an SPL for each of a plurality of different frequency bands of the source audio signal.

In other instances, the method further includes determining a signal-to-noise ratio (SNR) from the source audio signal and the gain adjusted ambient noise signal, wherein determining the SNR includes determining a sub-SNR for each of the different frequency bands, wherein selectively adjusting the SPL of each different frequency band of the source audio signal is based on an associated sub-SNR, and wherein generating the expanded audio signal includes selectively adjusting the source audio signal based on the SNR, or in accordance of a model of perceptual masking. In some aspects, selectively adjusting the SPL of each different frequency band of the source audio signal is based on an associated sub-SNR combined in weighted fashion with sub-SNR for lower frequency bands.

In some instances, the different frequency bands of the audio signal include a low frequency band, a mid-frequency band, and a high frequency band.

In some aspects, the SPL of the low frequency band is increased in response to the SNR satisfying a first threshold; the SPL of the low frequency band and mid-frequency band are increased in response to the SNR satisfying a second threshold; and the SPL of the low frequency band, mid-frequency band and high frequency band are increased in response to the SNR satisfying a third threshold, wherein the third threshold is greater than the second threshold, and the second threshold is greater than the first threshold.

In certain aspects, comparing the ambient noise signal with the hearing threshold includes comparing energy levels from each of a predefined set of frequency bands between the ambient noise signal and the hearing threshold.

In other cases, generating the effective noise signal includes determining a maxima between the ambient noise signal and the hearing threshold for each different frequency band of the predefined set of frequency bands, and using the maxima of each predefined set of frequency bands to provide the effective noise signal.

Two or more features described in this disclosure, including those described in this summary section, may be combined to form implementations not specifically described herein.

The details of one or more implementations are set forth in the accompanying drawings and the description below. Other features, objects and benefits will be apparent from the description and drawings, and from the claims.

BRIEF DESCRIPTION OF THE DRAWINGS

FIG. 6 depicts an illustrative form factor of an aware mode audio device according to various implementations.

Figure 1:
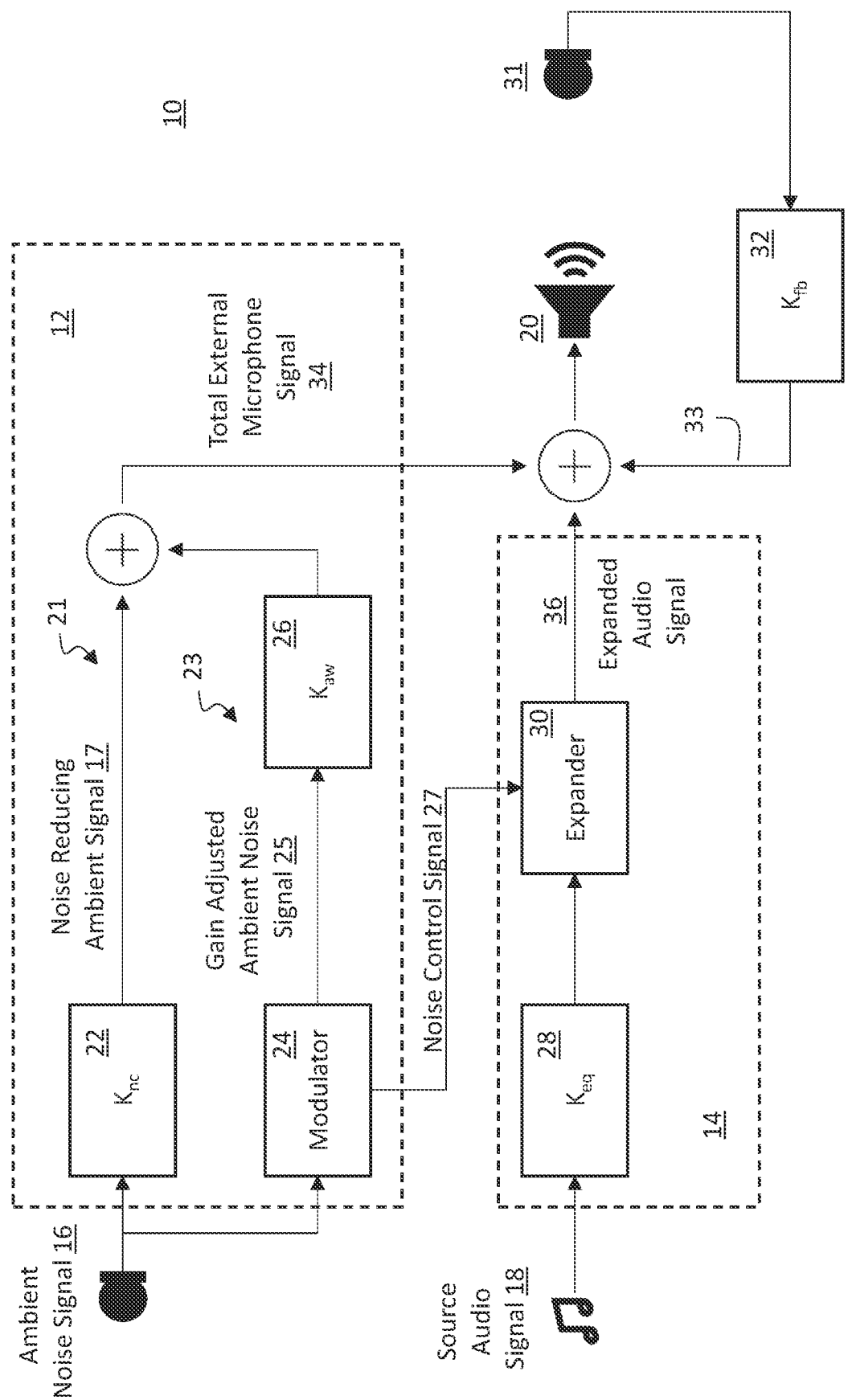
FIG. 1 depicts a block diagram of a wearable audio device having aware mode and audio-leveling features that provides auto-leveling according to various implementations.

It is noted that the drawings of the various implementations are not necessarily to scale. The drawings are intended to depict only typical aspects of the disclosure, and therefore should not be considered as limiting the scope of the implementations. In the drawings, like numbering represents like elements between the drawings.

DETAILED DESCRIPTION

Various implementations describe solutions that allow the use of Active Noise Reduction (ANR) in acoustic devices while concurrently allowing a user to be aware of ambient sounds, referred to herein as an "aware mode." Wearable ANR devices such as ANR headphones are used for providing potentially immersive listening experiences by reducing effects of environmental noise and sounds near the user (referred to herein as "ambient noise"). However, by blocking out the effect of the ambient noise, an ANR device may create an acoustic isolation from the environment, which may not be desirable in some conditions. For example, a user waiting at an airport may want to be aware of flight announcements while using ANR headphones. In another example, while using ANR headphones to cancel out the noise of an airplane in flight, a user may wish to be able to communicate with a flight attendant without having to take off the headphones.

Various technical challenges exist with aware mode audio devices including the fact that the type and amount of ambient noise may change while the device is being used. In order to provide a balanced user experience, the amount of noise reduction may need to be increased or decreased to keep the ambient noise at a desirable level. In addition, as ambient noise levels increase, the source audio content may need to be boosted to compensate for excess ambient noise reaching the user's ear. The approaches described herein address these as well as other technical challenges by providing an aware mode auto-leveler that automatically adjusts both the amount of noise cancellation and the amount of boost to provide a balanced user experience.

It is understood that the solutions disclosed herein are intended to be applicable to a wide variety of ANR based wearable audio devices, i.e., devices that are structured to be at least partly worn by a user in the vicinity of at least one of the user's ears to provide amplified audio for at least that one ear. ANR processing may include either or both feedback-based ANR and feedforward-based ANR. Illustrative wearable audio devices may include headphones, two-way communications headsets, earphones, earbuds, hearing aids, audio eyeglasses, wireless headsets (also known as "earsets") and ear protectors.

Additionally, the solutions disclosed herein are applicable to wearable audio devices that provide two-way audio communications, one-way audio communications (i.e., acoustic output of audio electronically provided by another device), or no communications, at all. Further, what is disclosed herein is applicable to wearable audio devices that are wirelessly connected to other devices, that are connected to other devices through electrically and/or optically conductive cabling, or that are not connected to any other device, at all. These teachings are applicable to wearable audio devices having physical configurations structured to be worn in the vicinity of either one or both ears of a user, including and not limited to, headphones with either one or two earpieces, over-the-head headphones, behind-the neck headphones, headsets with communications microphones (e.g., boom microphones), in-the-ear or behind-the-ear hearing aids, wireless headsets (i.e., earsets), audio eyeglasses, single earphones or pairs of earphones, as well as hats, helmets, clothing or any other physical configuration incorporating one or two earpieces to enable audio communications and/or ear protection. Presentation of specific implementations are intended to facilitate understanding through the use of examples and should not be taken as limiting either the scope of disclosure or the scope of claim coverage.

FIG. 1 depicts an illustrative implementation of an ANR-based audio device ("audio device") 10 that provides an auto-leveler for adaptively managing aware mode functionality. As shown, audio device 10 receives and processes a source audio signal 18 and an ambient noise signal 16. Source audio signal 18 may include any type of audio content, e.g., streaming music, telephonic communications, an audio feed from an audio-visual source, a streaming podcast, an audio recording, etc. Ambient noise signal 16 may for example include any type of environmental noise captured by an ANR feed-forward (i.e., external) microphone or any other microphone or array of microphones adapted to capture ambient noise near the user. In certain implementations, audio device 10 includes: (1) a first processing system 12 that adaptively passes some or all of an ambient noise signal 16, the resulting signal referred to herein as the "total external microphone signal" 34, and (2) a second processing system 14 that adaptively boosts the source audio signal 18 to generate an expanded noise signal 36. First processing system 12 and second processing system 14 operate together to adaptively implement an auto-leveler that provides a balanced user experience under changing ambient noise conditions. In the example device 10 shown in FIG. 1, the generated total external microphone signal 34, expanded noise signal 36 and feedback back signal 33 (generated by an ANR feedback filter Kth 32 and associated ANR feedback microphone 31) are combined and outputted to acoustic transducer 20. This results in an audio device 10 that allows the user to achieve a desirable balance of awareness of their surroundings, auditory comfort and enjoyment of media.

In some illustrative approaches, the first processing system 12 includes an ANR filter ($K_{nc}$) 22 that generates a noise reducing ambient signal 17 via a noise reduction path 21, and a modulator 24 that generates a gain adjusted ambient noise signal 25 via a pass-through signal path 23. In certain approaches, the amount of gain applied to the ambient noise signal 16 via the pass-through signal path 23 is based on the sound pressure level (SPL) of the ambient noise signal 16. In the depicted example, the gain adjusted ambient noise signal 25 is further processed by a pass-through filter ($K_{aw}$) 26 that shapes the outside microphone signal to operate in concert with the feedback based ANR provided by filter $K_{fb}$ 32. In certain aspects, $K_{aw}$ 26 equalizes the spectrum of ambient noise signal 16 such that it sounds natural, e.g., as if the signal 16 was un-occluded and the user was not wearing a headset. $K_{aw}$ 26 also ensures stability criteria are met for any acoustic path from the driver 20 to the outside microphone receiving the ambient noise signal 16.

The resulting noise reduced ambient signal 17 and gain adjusted ambient noise signal 25 are combined to generate the total external microphone signal 34.

Figure 2:
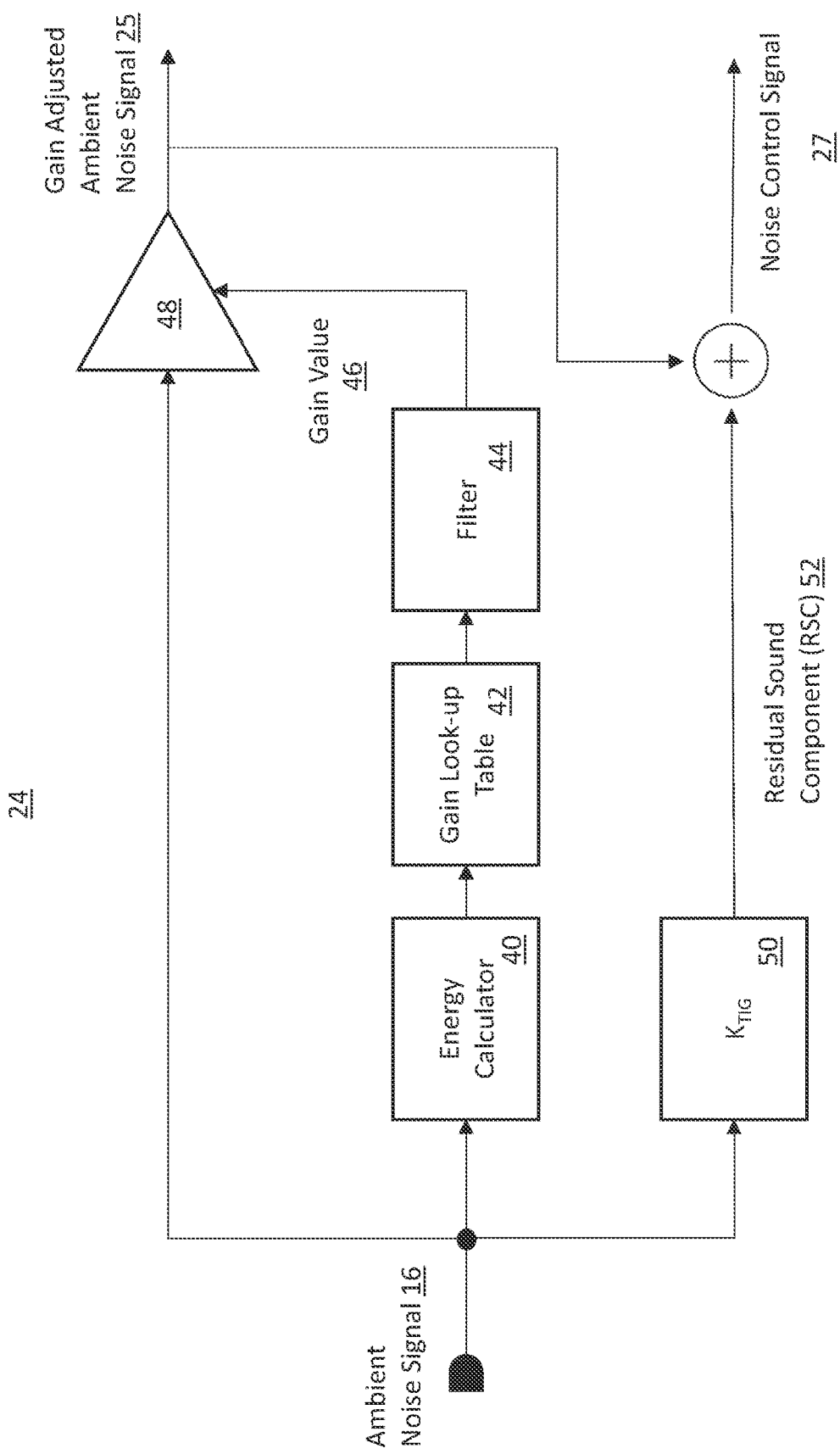
FIG. 2 depicts a block diagram of a utilized in the aware mode audio device according to various implementations.

FIG. 2 depicts an illustrative modulator 24 for generating the gain adjusted ambient noise signal 25, which includes a variable gain amplifier 48 that adjusts the ambient noise signal 16 based on a calculated gain value 46. In certain approaches, gain value 46 is determined with: (1) an energy calculator 40 that measures the SPL of the ambient noise signal 16, e.g., using A-weighting; (2) a gain look-up table 42 that determines a gain level based on a corresponding SPL; and (3) a filter 44 that, e.g., generates the gain value 46 by smoothing out gain levels obtained from the look-up table. Filter 44 controls the ballistics of the gain signal ensuring that the aware mode signal does not jump up and down quickly, allowing for smooth changes on long time constants.

In some implementations, the modulator 24 can be configured to control the amplifier 48 in accordance with one or more threshold conditions. The threshold conditions can be preset or set in accordance with a user-input. In some implementations, if the modulator 24 determines the ambient noise signal 16 to be below a particular threshold, the gain value 46 controls the amplifier 48 such that the gain of the pass-through signal path 23 is substantially equal to unity. This in turn allows a user to hear ambient sounds with little or no attenuation. In some implementations, if the modulator 24 determines the ambient noise signal 16 to be at or above the particular threshold, the gain value 46 can be configured to control the amplifier 48 such that the overall gain of the pass-through signal path 23 is less the unity, and the output of the ANR filter 22 (FIG. 1) provides attenuation of the ambient noise signal 16 at the ear. This allows the user to be aware of the environmental noise and sounds when the noise is below the threshold, yet take advantage of the ANR functionalities of the device 10 when the noise breaches a threshold—for example, to keep loud sounds such as vehicle sounds, sirens or machinery sounds from getting uncomfortably loud.

Figure 3:
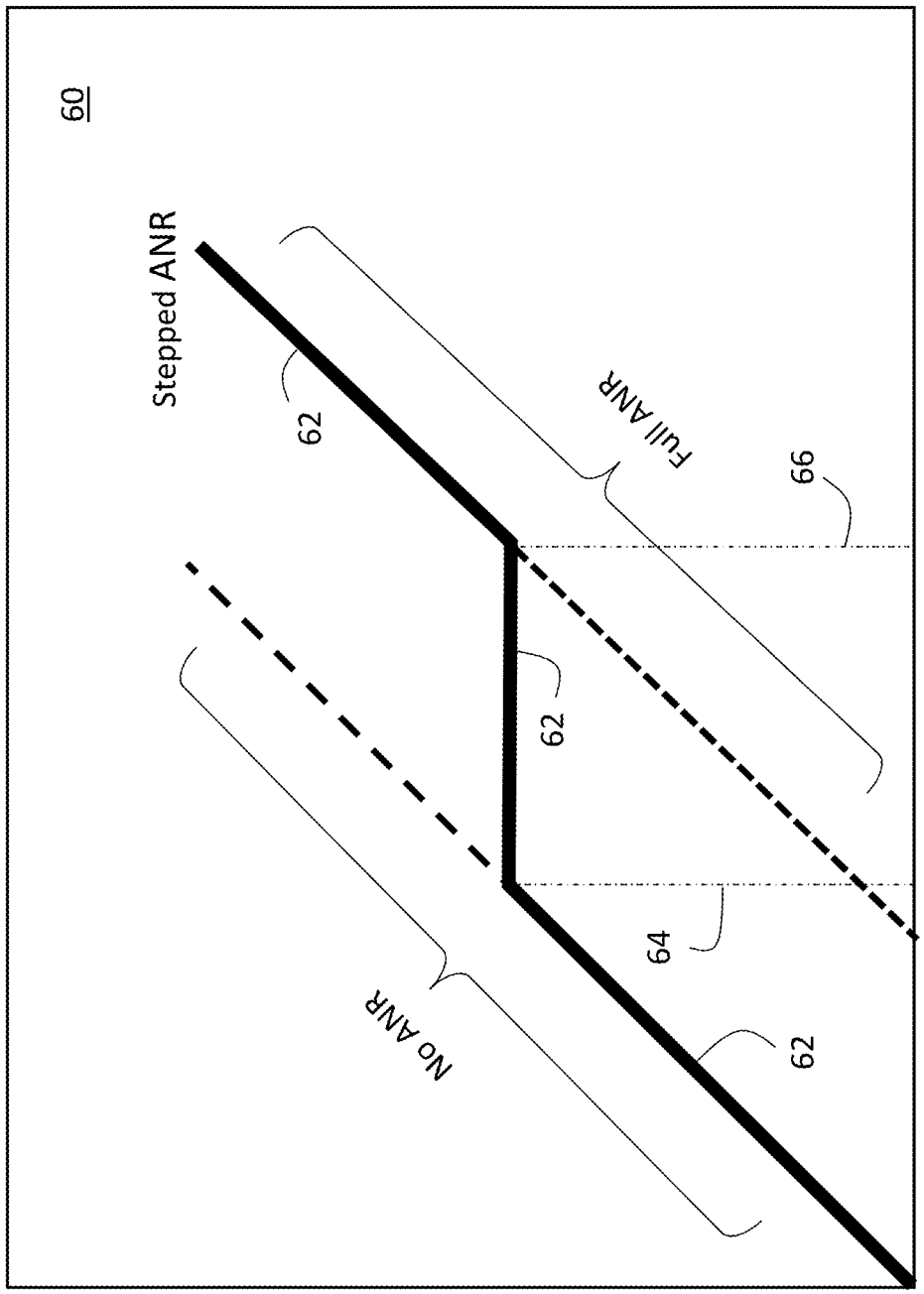
FIG. 3 depicts a hear-through characteristic graph according to various implementations.

FIG. 3 depicts an illustrative graph showing the level of gain adjusted ambient signal 25 as a function of the ambient noise signal 16. In this case, the gain adjusted ambient signal 25 is controlled by the modulator 24 that alters the amount of gain adjusted ambient signal 25 based on two threshold levels 64, 66 of the ambient noise signal 16. When the ambient noise signal 16 is below the first threshold 64, the gain adjusted ambient signal 25 is passed with substantially no reduction applied to the ambient noise signal 16 (e.g., gain value is set to 1). When the ambient noise signal 16 is above the first threshold 64 but below the second threshold 66, the gain adjusted ambient signal 25 is held a substantially constant level, i.e., the gain is reduced as the ambient noise signal 16 is increased to maintain a substantially constant sound pressure level at the ear (e.g., gain value varies between 1 and 0). When the ambient noise signal 16 is above the second threshold 66, the gain adjusted ambient signal 25 is set to minimum (e.g., gain value is set to 0). Note that in an alternative approach, the curve 62 could achieved with a compressor in which the slope between the first and second thresholds 64, 66 could be greater than 0.

Aspects relating to the first processing system 12 are further described in in US Patent Publication US2019/0130928, Compressive Hear-Through In Personal Acoustic Devices, published on May 2, 2019, which is hereby incorporated in its entirety by reference.

As noted herein, in certain implementations, one purpose of the first processing system 12 is to determine an amount of ambient noise that is to be passed through to the listener. In an alternative approach to what is described in FIGS. 1 and 2, rather than (or in addition to) controlling the gain value 46 in the hear-though path 23, the amount of noise reduction can be controlled by varying the feed-forward filter $K_{nc}$ 22 and/or feed-back filter Kth 32. By turning down the noise cancelling signals in this manner, $K_{aw}$ 26 does not need to overcome all the active noise reduction components, just the small passive noise reduction component(s).

Referring again to FIGS. 1 and 2, in addition to generating total external microphone signal 34, the first processing system 12 also outputs a noise control signal 27 to the second processing system 14. In certain approaches, the second processing system 14 automatically adjusts the SPL of the source audio signal 18, at least in part, on the comparison of the source audio signal 18 with the SPL of the ambient noise signal 16 (or a signal derived therefrom) to generate an expanded audio signal 36. In this manner, when the ambient noise becomes louder, the audio output of the audio device 10 is automatically adjusted louder. As the ambient noise changes, for example to a quieter environment having a lower SPL, the loudness of the audio output is reduced. In various approaches, the noise control signal 27 reflects how much ambient noise exists in the environment and is utilized to determine how much SPL expansion should be applied to the source audio signal 18. In some cases, second processing system 14 also includes an equalizer (Keq) 28 that initially processes the source audio signal 18, e.g., adjusting the frequency response to hit some target at the ear after being processed by the system.

In some instances, the noise control signal 27 is based on the gain adjusted ambient noise signal 25 generated by modulator 24. In the example modulator 24 shown in FIG. 2, the noise control signal 27 is a combination of the gain adjusted ambient noise signal 25 and a residual sound component (RSC) 52 generated by $K_{TTG}$ 50. In certain cases, $K_{TTG}$ 50 is a filter that attenuates the outside sound to model the residual sound that gets to the ear even with full ANR. In this case, the gain adjusted ambient noise signal 25 would be zero and the noise reducing ambient signal 17 would be non-zero. Therefore, the sum, i.e., the total external microphone signal 34 would be non-zero. RSC 52 thus provides the SPL that would be received at the ear when the sound is really loud outside and the total external microphone signal 34 is essentially shut off. In other approaches, rather than being implemented as a filter, $K_{TIG}$ 50 could simply be implemented as a scalar gain to provide RSC 52.

Figure 4:
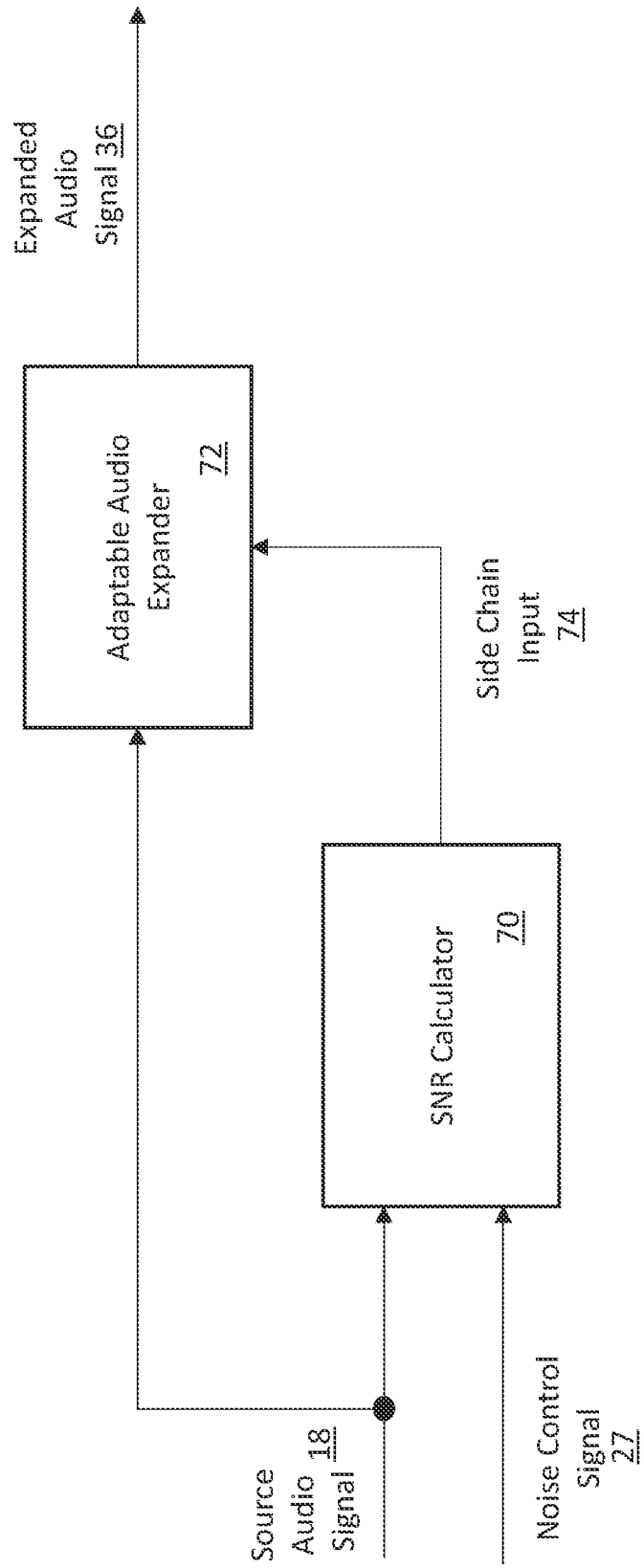
FIG. 4 depicts a block diagram of an expander utilized in the wearable audio device according to various implementations.

FIG. 4 depicts an illustrative embodiment of an expander 30 in which a signal-to-noise (SNR) calculator 70 is utilized to generate a side chain input 74 to control an adaptable audio expander 72. In certain cases, SNR calculator 70 receives both the source audio signal 18 and the noise control signal 27 (that in some instances includes, at least in part, the gain adjusted ambient noise signal 25), calculates an SNR value, and outputs side chain input 74. Side chain input 74 may consist of the calculated SNR value itself, or a value derived from the SNR value. SNR calculator 70 may include any system for evaluating a source audio signal relative to a noise signal and outputting a side chain value 74 that may include, e.g., a ratio, a difference, one or more derived values, etc. Regardless, the adaptable audio expander 72 uses the side chain input 74 to control expansion of the source audio signal 18, i.e., in generating the expanded audio signal 36. In certain cases, the higher the SNR value, the more SPL boost provided by the adaptable audio expander 72.

In the above implementation, the noise control signal 27 includes, at least in part, the gain adjusted ambient noise signal 25. In alternative approaches, rather than using the gain adjusted ambient noise signal 25 to calculate an SNR value (FIG. 1), noise control signal 27 can include calculated values that capture or predict one or more spectral characteristics of the ambient noise signal 16. In certain cases, the SPL or other information derived from the ambient noise signal 16 and/or total external microphone signal 34 can be analyzed, e.g., by a signal processor that uses a table of pre-calculated metrics, a machine learning system that evaluates the acoustic environment, etc., to generate one or more spectral characteristic values. The resulting value(s) can then be passed directly to the adaptable audio expander 72, which can utilize the values(s) to adaptively boost the source audio signal 18. Accordingly, noise control signal 27 may include any type of information or signal that captures, predicts, anticipates, etc., the amount of ambient noise in the environment.

According to various implementations, the amount or type of SPL expansion provided by expander 30 may be based on a number of factors. In some cases, the expansion is based on side chain input 74 threshold levels. In certain cases, different amounts of boost in SPL are applied to any number of different frequency bands. In an example, different boosts are applied to bass (i.e., low frequency), mid-range (i.e., mid-frequency), and/or treble (i.e., high frequency) bands. In an example, bass frequency bands refer to lower frequencies that are below 100 Hz, mid-range frequency bands refer to frequencies between 100 Hz and 4 kHz, and treble frequency bands refer to higher frequencies above 4 kHz. According to various implementations, the SPL boost applied to lower bass band frequencies is greater than the SPL boost applied to mid-range frequencies and the SPL boost applied to mid-range frequencies is greater than the SPL boost applied to treble frequencies.

In certain cases, the SPL of the low frequency band is increased in response to the SNR satisfying a first threshold; the SPL of the low frequency band and mid-frequency band are increased in response to the SNR satisfying a second threshold; and the SPL of the low frequency band, mid-frequency band and high frequency band are increased in response to the SNR satisfying a third threshold, where the third threshold is greater than the second threshold, and the second threshold is greater than the first threshold.

Table 1 provides example SPL boost values in dB applied to music audio based on the frequency range. The music has a constant SPL of 70 dB estimated at the user's ear. The ambient noise (obtained from the noise control signal 27) increases from 50 dB to 65 dB in increments of 5 dB. Because there is no or substantially no feedback path, the SPL boost applied per frequency range does not result in an increase (or substantial increase) in estimated music SPL at the user's ear. The increase in or decrease in SPL is independently controlled for each frequency range. As shown in Table 1, the SPL of the bass band frequencies are boosted more than the SPL of the mid-range frequencies, and the SPL of the mid-rage frequencies are boosted more than the SPL of the treble frequencies. Correspondingly, when the ambient noise decreases (i.e., SNR increases), for example, from 65 dB to 50 dB, the SPL of the bass band frequencies are decreased more than the SPL of the mid-range frequencies, and the SPL of the mid-range frequencies are decreased more than the SPL of the treble frequencies. Additionally, some limits can be placed on the maximum allowable gain in each band.

TABLE 1

| | | | | |
|---|---|---|---|---|
| Music SPL in dB | 70 | 70 | 70 | 70 |
| Noise SPL in dB | 50 | 55 | 60 | 65 |
| SNR | 1.4 | 1.27 | 1.17 | 1.08 |
| Bass Boost in dB | 0 | 0.7 | 7.7 | 11 |
| Mid-Range Boost in dB | 0 | 0 | 4.4 | 9.9 |
| Treble Boost in dB | 0 | 0 | 2.7 | 4 |

In certain approaches, sub-SNRs are determined for different frequency bands from the ambient noise signal and gain adjusted ambient noise signal by SNR calculator 70. Thus, for example, a sub-SNR may be determined for the bass, mid-range and treble to generate three side chain input values 74. The SPL of each different frequency band of the source audio signal 18 is then selectively adjusted by the adaptable audio expander 72 based on the associate sub-SNR.

Related aspects for implementing an expander are described in US Publication US2020/0143790, entitled "Ambient Volume Control in Open Audio Devices," Published on May 7, 2020, the contents of which are hereby incorporated by reference in its entirety.

Figure 5:
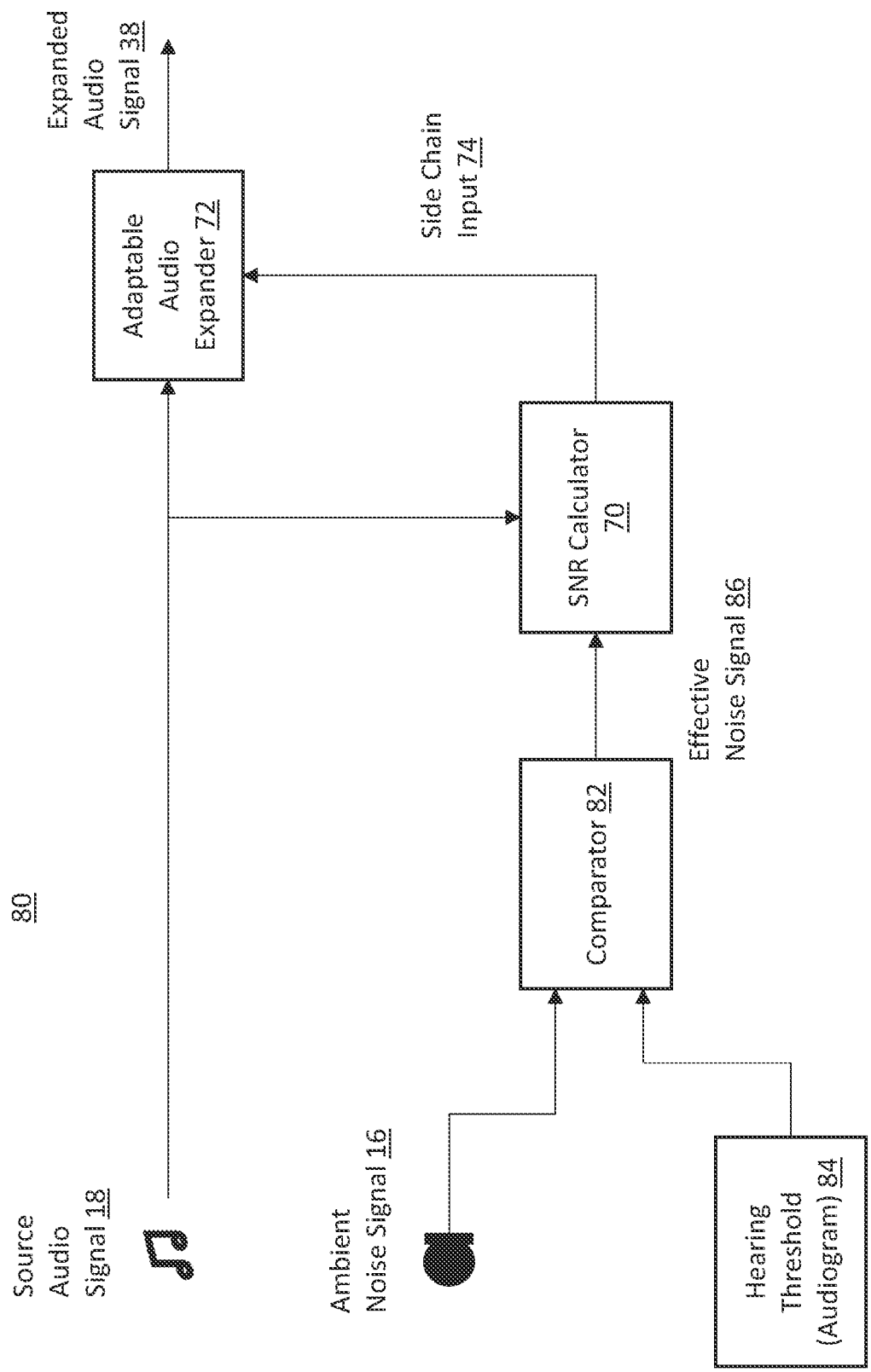
FIG. 5 depicts a block diagram of an enhanced expander utilized in the aware mode audio device according to various implementations.

Referring to FIG. 5, an enhanced expander 80 is depicted for generating expanded audio signal 38 from the source audio signal 18. In this approach, SNR calculator 70 utilizes an effective noise signal 86 generated by a comparator 82 to determine the side chain input 74 to the audio expander 72. In certain approaches, comparator 82 compares energy levels of the ambient noise signal 16 to an audiogram of a predefined hearing threshold 84 of the user and uses the maxima of the two as the effective noise signal 86. By employing the predefined hearing threshold 84, the user will only hear content if it is loud enough (i.e., on a frequency-by-frequency basis) and it is not masked by noise (again, on a frequency-by-frequency basis). As such, masking due to hearing loss or to ambient sound are equivalent and the same methods can be used to ensure the listener perceives full-spectrum sound.

In some cases, the comparator 82 compares energy levels of a predefined set of frequency bands or the entire range. In certain cases where predefined frequency bands are compared, the maxima of the comparison of each predefined set of frequency bands are combined to provide the effective noise signal 86. In other cases where predefined frequency bands are compared, the maxima of the comparison of each predefined set of frequency bands can be used to determine sub-SNRs by SNR calculator 70. The resulting sub-SNRs can then be used by the audio expander 72 to control expansion of the individual frequency bands. (In various cases, maxima is the largest value of signal, either within a given range, or on the entire domain.)

It is understood that enhanced expander 80 could be implemented separately from, or be integrated with, the first processing system 12 (FIG. 1). In the case that expander 80 is integrated with the first processing system 12, the ambient noise signal 16 may include a gain adjusted ambient noise signal 25 or other noise control signal 27 derived from the ambient noise signal 16. When implemented separately, ambient noise signal 16 may be obtained, e.g., from any external microphone.

It is understood that the device 10 shown and described according to various implementations may be structured to be worn by a user to provide an audio output to a vicinity of at least one of the user's ears. The device 10 may have any of a number of form factors, including configurations that incorporate a single earpiece to provide audio to only one of the user's ears, others that incorporate a pair of earpieces to provide audio to both of the user's ears, and others that incorporate one or more standalone speakers to provide audio to the environment around the user.

FIG. 6 is a block diagram of an example form factor of an in-ear wearable audio device 100 having two earpieces 112A and 112B, each configured to direct sound towards an ear of a user. (Reference numbers appended with an "A" or a "B" indicate a correspondence of the identified feature with a particular one of the two earpieces. The letter indicators are however omitted from the following discussion for simplicity, e.g., earpiece 112 refers to either or both earpiece 112A and earpiece 112B.) Each earpiece 112 includes a casing 114 that defines a cavity 116 that contains an electroacoustic transducer 128 for outputting audio signals to the user. In addition, at least one inner microphone 118 is also disposed within cavity 116. In implementations where wearable audio device 100 is ear-mountable, an ear coupling 120 (e.g., an ear tip or ear cushion) attached to the casing 114 surrounds an opening to the cavity 116. A passage 122 is formed through the ear coupling 120 and communicates with the opening to the cavity 116. In various implementations, one or more outer microphones 124 are disposed on the casing in a manner that permits acoustic coupling to the environment external to the casing 112.

Audio output by the transducer 128 that include both source audio and total external microphone signals are implemented by audio processing system 130, which incorporate the first and second processing system 12, 14 described herein. Audio processing system 130 may be integrated into one or both earpieces 112, or be implemented by an external system. In the case where audio processing system 130 is implemented by an external system, each earpiece 112 may be coupled to the audio processing system 130 either in a wired or wireless configuration. In various implementations, audio processing system 130 may include hardware, firmware and/or software to provide various features to support operations of the wearable audio device 100, including, e.g., providing a power source, amplification, input/output, network interfacing, user control functions, ANR, signal processing, data storage, data processing, voice detection, etc.

In implementations that include ANR for enhancing audio signals, the inner microphones 118 may serve as a feedback microphones and the outer microphones 124 may serve as feedforward microphones. In such implementations, each earphone 112 may utilize an ANR circuit that is in communication with the inner and outer microphones 118 and 124. The ANR circuit receives an internal signal generated by the inner microphone 118 and an external signal generated by the outer microphones 124 and performs an ANR process for the corresponding earpiece 112. The process includes providing a signal to an electroacoustic transducer (e.g., speaker) 128 disposed in the cavity 116 to generate an anti-noise acoustic signal that reduces or substantially prevents sound from one or more acoustic noise sources that are external to the earphone 112 from being heard by the user.

It is understood that one or more of the functions of the described systems may be implemented as hardware and/or software, and the various components may include communications pathways that connect components by any conventional means (e.g., hard-wired and/or wireless connection). For example, one or more non-volatile devices (e.g., centralized or distributed devices such as flash memory device(s)) can store and/or execute programs, algorithms and/or parameters for one or more described devices. Additionally, the functionality described herein, or portions thereof, and its various modifications (hereinafter "the functions") can be implemented, at least in part, via a computer program product, e.g., a computer program tangibly embodied in an information carrier, such as one or more non-transitory machine-readable media, for execution by, or to control the operation of, one or more data processing apparatus, e.g., a programmable processor, a computer, multiple computers, and/or programmable logic components.

A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a network.

Actions associated with implementing all or part of the functions can be performed by one or more programmable processors executing one or more computer programs to perform the functions. All or part of the functions can be implemented as, special purpose logic circuitry, e.g., an FPGA (field programmable gate array) and/or an ASIC (application-specific integrated circuit). Processors suitable for the execution of a computer program include, by way of example, both general and special purpose microprocessors, and any one or more processors of any kind of digital computer. Generally, a processor may receive instructions and data from a read-only memory or a random access memory or both. Components of a computer include a processor for executing instructions and one or more memory devices for storing instructions and data.

It is noted that while the implementations described herein utilize microphone systems to collect input signals, it is understood that any type of sensor can be utilized separately or in addition to a microphone system to collect input signals, e.g., accelerometers, thermometers, optical sensors, cameras, etc.

Additionally, actions associated with implementing all or part of the functions described herein can be performed by one or more networked computing devices. Networked computing devices can be connected over a network, e.g., one or more wired and/or wireless networks such as a local area network (LAN), wide area network (WAN), personal area network (PAN), Internet-connected devices and/or networks and/or a cloud-based computing (e.g., cloud-based servers).

In various implementations, electronic components described as being "coupled" can be linked via conventional hard-wired and/or wireless means such that these electronic components can communicate data with one another. Additionally, sub-components within a given component can be considered to be linked via conventional pathways, which may not necessarily be illustrated.

A number of implementations have been described. Nevertheless, it will be understood that additional modifications may be made without departing from the scope of the inventive concepts described herein, and, accordingly, other implementations are within the scope of the following claims.

What is claimed is:

1. A method comprising:
   receiving an ambient noise signal from a microphone associated with a wearable audio device;
   determining a gain value based on a sound pressure level (SPL) of the ambient noise signal;
   generating a gain adjusted ambient noise signal by applying the gain value to the ambient noise signal;
   generating a total external microphone signal by adding the gain adjusted ambient noise signal to a noise reducing ambient signal;
   generating an expanded audio signal by selectively adjusting a source audio signal based on the gain adjusted ambient noise signal; and
   combining and outputting the expanded audio signal with the total external microphone signal to an acoustic transducer.

2. The method of claim 1, further comprising determining a signal-to-noise ratio (SNR) from the source audio signal and the gain adjusted ambient noise signal,
   wherein generating the expanded audio signal comprises selectively adjusting the source audio signal based on the SNR.

3. The method of claim 1, wherein adjusting the source audio signal to generate the expanded audio signal is based on a combination of the gain adjusted ambient noise signal and a residual sound component, wherein the residual sound component is based on the SPL of the ambient noise signal.

4. The method of claim 1, wherein the gain value is determined with a look-up table having an SPL-to-gain value correspondence, the look-up table comprising:
   a first SPL threshold below which the gain value is set to 1;
   a second SPL threshold above which the gain value is set to 0; and
   an SPL range between the first SPL threshold and the second SPL threshold within which the gain value varies between 1 and 0.

5. The method of claim 1, wherein generating the expanded audio signal includes selectively adjusting an SPL for each of a plurality of different frequency bands of the source audio signal.

6. The method of claim 5, further comprising determining a signal-to-noise ratio (SNR) from the source audio signal and the gain adjusted ambient noise signal,
   wherein determining the SNR comprises determining a sub-SNR for each of the different frequency bands, and
   wherein selectively adjusting the SPL of each different frequency band of the source audio signal is based on an associated sub-SNR.

7. The method of claim 5, wherein the different frequency bands of the audio signal comprise a low frequency band, a mid-frequency band, and a high frequency band.

8. The method of claim 7, wherein:
   the SPL of the low frequency band is increased in response to the SNR satisfying a first threshold;
   the SPL of the low frequency band and mid-frequency band are increased in response to the SNR satisfying a second threshold; and
   the SPL of the low frequency band, mid-frequency band and high frequency band are increased in response to the SNR satisfying a third threshold,
   wherein the third threshold is greater than the second threshold, and the second threshold is greater than the first threshold.

9. A wearable audio device, comprising:
   an acoustic transducer;
   a microphone; and
   a signal processing system that performs actions comprising:
     receiving an ambient noise signal from a microphone associated with a wearable audio device;
     determining a gain value based on a sound pressure level (SPL) of the ambient noise signal;
     generating a gain adjusted ambient noise signal by applying the gain value to the ambient noise signal;
     generating a total external microphone signal by adding the gain adjusted ambient noise signal to a noise reducing ambient signal;
     generating an expanded audio signal by selectively adjusting a source audio signal based on the gain adjusted ambient noise signal; and
     combining and outputting the expanded audio signal with the total external microphone signal to an acoustic transducer.

10. The device of claim 9, further comprising determining a signal-to-noise ratio (SNR) from the source audio signal and the gain adjusted ambient noise signal,
    wherein generating the expanded audio signal comprises selectively adjusting the source audio signal based on the SNR.

11. The device of claim 9, wherein adjusting the source audio signal to generate the expanded audio signal is based on a combination of the gain adjusted ambient noise signal and a residual sound component, wherein the residual sound component is based on the SPL of the ambient noise signal.

12. The device of claim 9, wherein the gain value is determined with a look-up table having an SPL-to-gain value correspondence, the look-up table comprising:
    a first SPL threshold below which the gain value is set to 1;
    a second SPL threshold above which the gain value is set to 0; and
    an SPL range between the first SPL threshold and the second SPL threshold within which the gain value varies between 1 and 0.

13. The device of claim 9, further comprising determining a signal-to-noise ratio (SNR) from the source audio signal and the gain adjusted ambient noise signal,
    wherein determining the SNR comprises determining a sub-SNR for each of the different frequency bands, and
    wherein selectively adjusting the SPL of each different frequency band of the source audio signal is based on an associated sub-SNR.

14. The device of claim 13, wherein the different frequency bands of the audio signal comprise a low frequency band, a mid-frequency band, and a high frequency band, and wherein:
- the SPL of the low frequency band is increased in response to the SNR satisfying a first threshold;
- the SPL of the low frequency band and mid-frequency band are increased in response to the SNR satisfying a second threshold; and
- the SPL of the low frequency band, mid-frequency band and high frequency band are increased in response to the SNR satisfying a third threshold,
- wherein the third threshold is greater than the second threshold, and the second threshold is greater than the first threshold.

15. The method of claim 1, wherein combining and outputting the expanded audio signal with the total external microphone signal to an acoustic transducer provides an auto leveling response to changing ambient noise conditions.

16. The method of claim 15, wherein the auto leveling response enhances a user experience with the wearable audio device.

17. The method of claim 1, wherein the total external microphone signal is non-zero.

18. The device of claim 9, wherein combining and outputting the expanded audio signal with the total external microphone signal to an acoustic transducer provides an auto leveling response to changing ambient noise conditions.

19. The device of claim 9, wherein the total external microphone signal is non-zero.

* * * * *